United States Patent
Askin et al.

Patent Number: 5,293,083
Date of Patent: Mar. 8, 1994

[54] FAST LIMITED SWING PUSH-PULL DRIVER

[75] Inventors: Haluk O. Askin, Clinton Corners; David T. Hui, Poughkeepsie; Bijan Salimi, Wappingers Falls; Charles B. Winn, Hyde Park, all of N.Y.

[73] Assignee: International Business Machines Corporation, Armonk, N.Y.

[21] Appl. No.: 906,811

[22] Filed: Jun. 30, 1992

[51] Int. Cl.⁵ ............................ H03K 19/003
[52] U.S. Cl. .................... 307/443; 307/455; 307/540
[58] Field of Search .............. 307/443, 455, 456, 540

[56] References Cited

U.S. PATENT DOCUMENTS

| | | | |
|---|---|---|---|
| 4,513,283 | 4/1985 | Leininger | 340/825 |
| 4,686,392 | 8/1987 | Lo | 307/448 |
| 4,760,289 | 7/1988 | Eichelberger et al. | 307/455 |
| 4,866,303 | 9/1989 | Kanai et al. | 307/443 |
| 4,874,970 | 10/1989 | Coy et al. | 307/455 X |
| 4,906,869 | 3/1990 | Masuoka | 307/455 |
| 5,012,128 | 4/1991 | Chan | 307/455 X |
| 5,013,938 | 5/1991 | Estrada | 307/455 |
| 5,124,591 | 6/1992 | Chan et al. | 307/494 |
| 5,134,312 | 7/1992 | Jones, Jr. et al. | 307/455 X |

FOREIGN PATENT DOCUMENTS

| | | | |
|---|---|---|---|
| 4474367 | 3/1992 | European Pat. Off. | G06F 13/40 |
| 61293022 | 5/1987 | Japan | H03K 19/92 |

OTHER PUBLICATIONS

IBM Tech. Disclosure Bulletin, vol. 33, No. 1A, Jun. 1990 "Cascode Logic Buffered Circuit with Regulated Push-Pull".

*Primary Examiner*—David R. Hudspeth
*Attorney, Agent, or Firm*—Floyd A. Gonzalez; Robert L. Troike

[57] ABSTRACT

An improved differential cascode current push-pull driver is provided by controlling the up level by clamping the collector node with respect to output signal reference VR to less than VCC. The collector resistors are made smaller so there is smaller signal swing and faster operation.

6 Claims, 2 Drawing Sheets

FAST LIMITED SWING PUSH-PULL DRIVER

FIELD OF INVENTION

This invention relates to push-pull drivers and more particularly to a driver that consumes less power and has faster switching speed.

BACKGROUND OF INVENTION

In present day data processing systems most of the circuits, and more particularly the logic circuits, are in the form of integrated circuits. Efforts continue to be made to increase the density of the integration of the circuit components on a single semiconductor substrate or chip. In a typical system there may be a hundred such chips in one thermal conduction module (TCM). There may be several TCMs in a computer system. For today's bipolar logic chips, logic performance speed is a function of the power that is available for the critical logic paths and circuit delays. For chips with five thousand or more logic gates the power budget and delays indeed limit the speed of the computer system it is used in. Push-pull drivers are widely used on these logic chips in all off-chip applications. There is a need for faster and more efficient drivers for driving signals between chips. The use of differential cascode current switch circuitry is well known, as disclosed in U.S. Pat. No. 4,513,283 of Lininger entitled "Latch Circuits with Differential Cascode Current Switch Logic", U.S. Pat. No. 4,760,289 of Eichelberger et al. entitled "Two Level Differential Cascode Current Switch Masterslice" and U.S. Pat. No. 4,686,392 of Lo. The driver used herein is particularly for use with differential cascode circuitry which requires less current and is lower power than ECL (Emitter Coupled Logic) circuitry. The logic is provided by a pair of wires, and for a logic "1" level, 0.6 volts is on one lead and 0.4 volts is on the other lead, and for a logic "0", the levels are reversed. A 20 percent increase in performance is believed to be achieved using this differential cascode current switch as compared to an ECL masterslice running the same power.

A two level differential cascode driver is also disclosed in Chu et al., U.S. Pat. No. 5,124,591 issued Jun. 23, 1992, entitled "Low Power Push Pull Driver", incorporated herein by reference (case has been allowed).

SUMMARY OF THE INVENTION

In accordance with one embodiment of the present invention, a push-pull driver that consumes less power and has faster switching times is provided by first and second driver transistors connected in series across a source of potential with the emitter of the first transistor and the collector of the second transistor forming the output node. A differential current predriver includes a third and fourth transistor with their emitters coupled to a current source. The collector of the third transistor is coupled to the base of the first transistor and the collector of the fourth transistor is coupled to the base of a fifth transistor used as an emitter follower and the emitter of the fifth transistor coupled to the base of the second transistor. The collector load resistors of the third and fourth transistors are coupled to a fixed voltage smaller than said source of potential.

DESCRIPTION OF PREFERRED EMBODDIMENT

A description of prior art differential cascode drivers is found in the Chu et al. application cited above.

Figure 1:
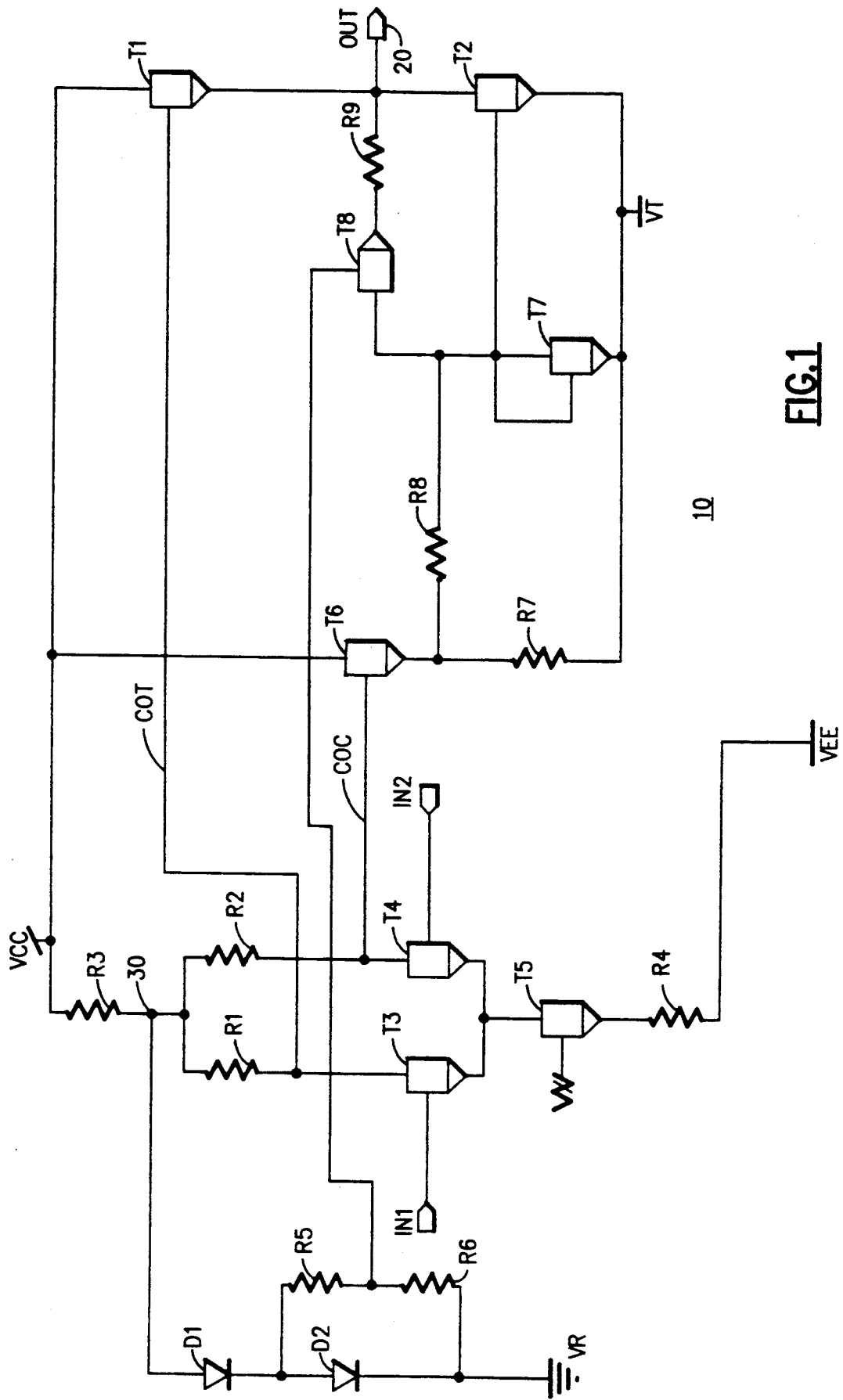
FIG. 1 is a schematic diagram of the invention in accordance with the preferred embodiment of the present invention.

The circuit shown in FIG. 1 is a push-pull driver 10 including large power driver transistors T1 and T2 connected in series between VCC and VT with the junction of these transistors connected to an output terminal 20. A differential cascode current switch predriver of lower power handling transistors includes transistors T3 and T4 coupled as a differential amplifier. The collector of T3 is coupled to node 30 through load resistor R1, and the collector of transistor T4 is connected to node 30 through load resistor R2. Node 30 is connected through resistor R3 to VCC. Node 30 is clamped to ground reference potential VR through a pair of series connected diodes D1 and D2. The differential cascode current pair of transistors T3 and T4 have their emitters coupled to a current source comprising transistor T5 and resistor R4 which powers the switch. The differential cascode circuit has two wires for input at IN1 and IN2 to transistors T3 and T4 respectively. The differential signal at IN1 and IN2 steers the current through the transistors T3 and T4. The voltage drop across collector resistor R1 controls the conduction or cutoff of transistor T1 which has its base directly connected to COT node between the transistor T3 and resistor R1. The COC node between the resistor R2 and transistor T4 is coupled the base of transistor T6. Transistor T6 is coupled as an emitter follower between VCC and VT with a resistor R7 coupled between the emitter of transistor T6 and VT which functions as an emitter follower to voltage VT. The emitter follower output at the junction of R7 and transistor T6 is coupled via resistor R8 to the base of the lower of the push-pull power transistor T2. A down level clamp is provided by transistors T7 and T8. Transistor T7 is coupled as a diode limiter between the base and emitter of the down level power transistor T2. Both the base and collector of transistor T7 is coupled to the base of transistor T2, and the emitter of transistor T7 like T2 is coupled to VT. The transistor T8 has the collector coupled to the base of transistor T2 and the emitter to the output node 20 via resistor R9. A clamping voltage is provided to the base of transistor T8 to limit the down level to −0.4 volts. This down level clamp is provided according to the preferred embodiment off the same diode clamp as the up-level. A resistor divider of resistors R5 and R6 are connected in parallel across the lower diode D2. A center tap at the required voltage is coupled to the base of transistor T8 to provide a down level clamp that is clamped with respect to reference potential. This second clamp could also be as provided in FIG. 2 by a separate VCC to ground circuit.

In accordance with the preferred embodiment the circuit elements had the following values:

| | | | |
|---|---|---|---|
| VCC | = 1.4 volts | VEE | = −2.2 volts |
| VT | = −0.7 volts | VX | = −0.82 volts |

-continued

R1,R2 = 0.75K    R5 = 10K   R8 = 0.5K
R3 = .1K          R6 = 20K   R9 = .05K
R4 = .6K         R7 = 1.5K

Figure 2:
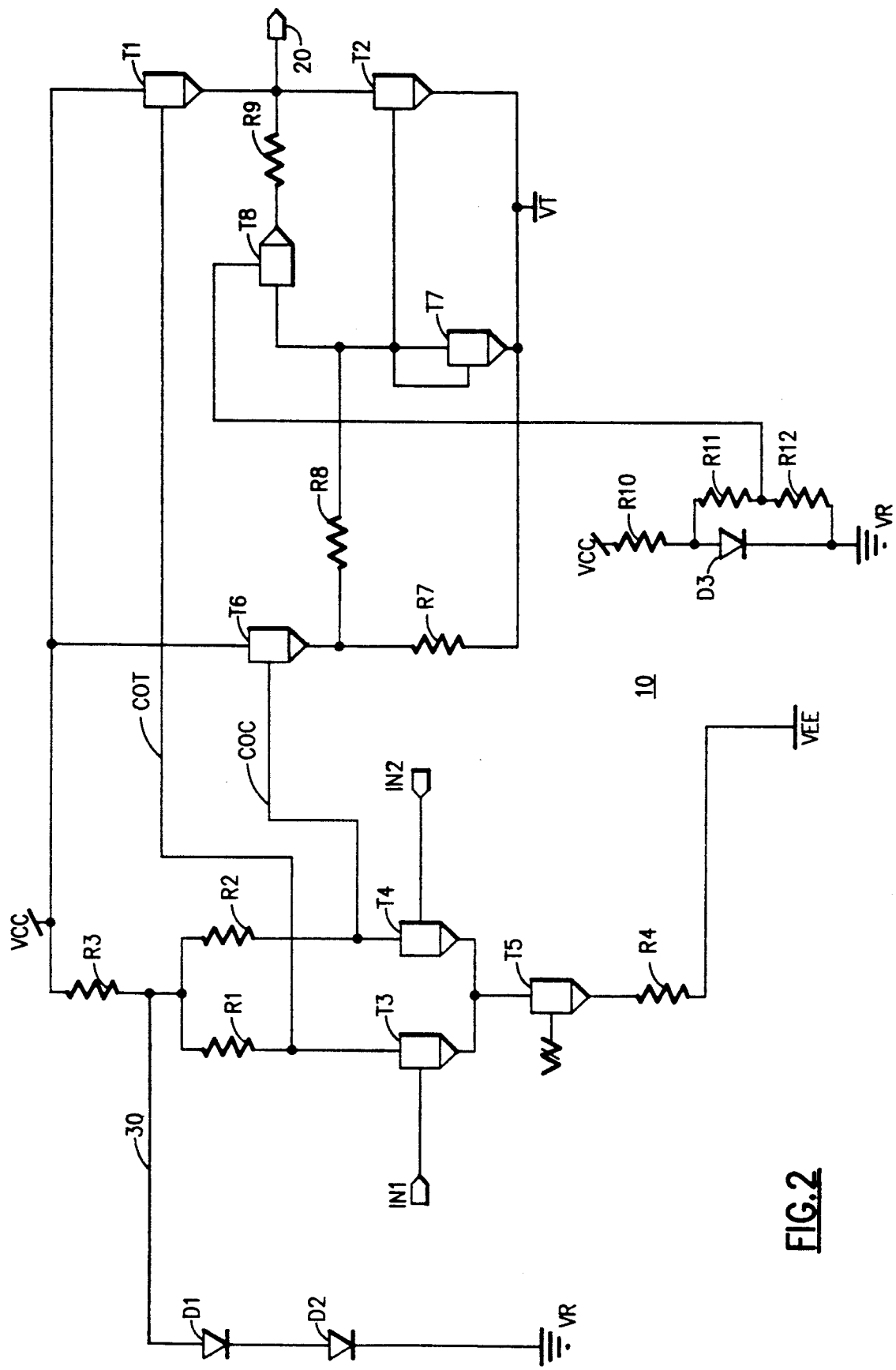
FIG. 2 is a schematic diagram of the invention in accordance with an alternative embodiment of the present invention.

For FIG. 2 the same as above plus the following:

R10 = 5K
R11, 12 = 20K

In the operation the improvement is achieved by controlling the up-level by clamping the collector common node 30 with respect to output signal reference VR to less than VCC. The collector resistors are smaller so there is smaller signal swing and the operation is faster. A smaller signal swing is tolerated because the node is clamped with respect to output signal reference. The resistor divider second clamped node is designed to limit the output to a smaller signal swing which makes the switching faster and is tolerated because the reference is again with respect to reference voltage VR at ground. Because this second clamp is using the same clamping source, it uses less power.

We claim:

1. A push-pull driver including means for providing a source of potential with first and second driver transistors connected in series with said source of potential with the emitter of said first transistor connected to the collector of said second transistor at the output node, a differential pair predriver including a third and fourth transistor coupled together at the emitters to a current source, said collector of said third transistor coupled to the base of said first transistor and a first load resistor and the collector of said fourth transistor coupled to a second load resistor and through an emitter follower to the base of said second transistor, the input driver signal applied to the base of one or differentially to both of said third and fourth transistors, the improvement for decreasing the switching times of said driver and lowering the power dissipation comprising a sixth transistor connected between the output node and the base of the second transistor and means for providing a first fixed voltage smaller than said source of potential to the first and second load resistors and providing a second smaller fixed voltage to the base of the sixth transistor to limit both the up and down levels at the output node.

2. A push-pull driver including means for providing a source of potential with first and second driver transistors connected in series with said source of potential with the emitter of said first transistor connected to the collector of said second transistor at the output node, a differential pair predriver including a third and fourth transistor coupled together at the emitters to a current source, said collector of said third transistor coupled to the base of said first transistor and a first load resistor and the collector of said fourth transistor coupled to a second load resistor and through an emitter follower to the base of said second transistor, the input driver signal applied to the base of one or differentially to both of said third and fourth transistors, the improvement for decreasing the switching times of said driver and lower the power dissipation comprising means for providing a fixed voltage smaller than said source of potential to said first and second load resistors. wherein said means for providing said fixed voltage includes a third resistance connected at a node between said means for providing said source of potential and said first and second load resistors and a clamping means connected between said first and second load resistors and a reference potential whereby the up-level is clamped and said voltage swing across said load registers is safely limited saving power and providing faster swing time.

3. The driver of claim 2 wherein said clamping means includes a pair of series connected diodes connected in series between said first and second resistors and said reference potential.

4. The combination of claim 3 including a sixth transistor connected between the output node and the base of said second transistor with the base of said sixth transistor coupled to a second clamping means for providing down level clamping.

5. The combination of claim 4 wherein said second clamping means includes resistor and a diode connected in series between said source of potential and said reference potential and wherein a pair of resistors are connected in series across said diode connected to said reference potential and said down level clamping is provided by coupling the node joining said resistors to said base of said sixth transistor.

6. The combination of claim 4 including a diode coupled between said base emitter of said second transistor.

* * * * *